United States Patent
Fein et al.

(10) Patent No.: US 7,323,993 B2
(45) Date of Patent: Jan. 29, 2008

(54) VARIATION OF CONDUCTIVE CROSS SECTION AND/OR MATERIAL TO ENHANCE PERFORMANCE AND/OR REDUCE MATERIAL CONSUMPTION OF ELECTRONIC ASSEMBLIES

(75) Inventors: Michael Fein, Ann Arbor, MI (US); Daniel P. Lawrence, Ann Arbor, MI (US)

(73) Assignee: ZIH Corp., Hamilton (BM)

( * ) Notice: Subject to any disclaimer, the term of this patent is extended or adjusted under 35 U.S.C. 154(b) by 97 days.

(21) Appl. No.: 10/979,874

(22) Filed: Nov. 2, 2004

(65) Prior Publication Data

US 2006/0092025 A1 May 4, 2006

(51) Int. Cl.
*G08B 13/14* (2006.01)
(52) U.S. Cl. .............................. 340/572.7; 340/572.1; 343/700 MS
(58) Field of Classification Search .......... 340/572.1, 340/572.7; 343/700 MS
See application file for complete search history.

(56) References Cited

U.S. PATENT DOCUMENTS

| | | | | |
|---|---|---|---|---|
| 5,779,839 | A * | 7/1998 | Tuttle et al. ................. | 156/213 |
| 6,147,605 | A * | 11/2000 | Vega et al. .............. | 340/572.7 |
| 6,259,408 | B1 | 7/2001 | Brady et al. | |
| 6,337,667 | B1 * | 1/2002 | Ayala et al. ................. | 343/795 |
| 6,407,669 | B1 * | 6/2002 | Brown et al. ............. | 340/572.1 |
| 6,999,028 | B2 * | 2/2006 | Egbert .................. | 343/700 MS |
| 7,050,011 | B2 * | 5/2006 | Ghabra et al. ............... | 343/711 |
| 7,057,562 | B2 * | 6/2006 | Forster et al. ....... | 343/700 MS |
| 2002/0071399 | A1 | 6/2002 | Smith | |

FOREIGN PATENT DOCUMENTS

| | | |
|---|---|---|
| EP | 0 855 674 A2 | 7/1998 |
| WO | WO 00/11749 | 3/2000 |
| WO | WO 2005/096435 A1 | 10/2005 |

OTHER PUBLICATIONS

International Search Report dated Mar. 24, 2006 for International Application No. PCT/US2005/039486.
Written Opinion of the International Searching Authority for International Application No. PCT/US2005/039486, Mar. 24, 2006.

* cited by examiner

*Primary Examiner*—Jeffery Hofsass
*Assistant Examiner*—Samuel J Walk
(74) *Attorney, Agent, or Firm*—Alston & Bird LLP

(57) ABSTRACT

An RFID antenna is fabricated according to varying current density requirements of different regions of the antenna. A method such as computer modeling is used to determine the current densities of the antenna regions. In one aspect of the invention, a conductive material is printed to a substrate at varying thickness according to current density requirements of particular antenna regions. In another aspect of the invention, materials of different conductivity are printed to the substrate according to the current density requirements. A material of higher conductivity is printed at an antenna region that requires high current density, and a material of lower conductivity is printed at antenna region that requires lower current density.

37 Claims, 4 Drawing Sheets

VARIATION OF CONDUCTIVE CROSS SECTION AND/OR MATERIAL TO ENHANCE PERFORMANCE AND/OR REDUCE MATERIAL CONSUMPTION OF ELECTRONIC ASSEMBLIES

FIELD OF THE INVENTION

The present invention relates to radio frequency identification (RFID) antennas, and more particularly to a printing process for RFID antennas.

BACKGROUND OF THE INVENTION

Integrated circuits (ICs) are the basic building blocks that are used to create electronic devices. Continuous improvements in IC process and design technologies have led to smaller, more complex, and more reliable electronic devices at a lower cost per function. As performance has increased and size and cost have decreased, the use of ICs has expanded significantly.

One particular type of IC that would benefit from inexpensive mass production involves the use of radio frequency identification (RFID) technology. RFID technology incorporates the use of electromagnetic or electrostatic radio frequency (RF) coupling. Traditional forms of identification such as barcodes, cards, badges, tags, and labels have been widely used to identify items such as access passes, parcels, luggage, tickets, and currencies. However, these forms of identification may not protect items from theft, misplacement, or counterfeit, nor do they allow "touch-free" tracking.

More secure identification forms such as RFID technology offer a feasible and valuable alternative to traditional identification and tracking. RFID does not require physical contact and is not dependent on line-of-sight for identification. RFID technology is widely used today at lower frequencies, such as 13.56 MHz, in security access and animal identification applications. Higher-frequency RFID systems ranging between 850 MHz and 2.5 GHz have recently gained acceptance and are being used in applications such as vehicular tracking and toll collecting, and in business logistics such as manufacturing and distribution.

A printing process is used to print conductive traces on a substrate to form a functional electronic structure such as an RFID antenna. The RFID antenna absorbs, couples with, and/or reflects radio frequency signals from a transmitter and provides a signal and power to an attached integrated circuit. The conductance of the antenna is determined by material properties of the antenna and the thickness of the conductive traces. For example, some areas of the antenna may need to conduct more current than other areas of the antenna; therefore, a greater amount of conductive material must be used when higher current density is required. However, a process such as screen printing applies a single layer of film of conductive ink at a generally constant thickness.

SUMMARY OF THE INVENTION

An RFID tag comprises a substrate. An antenna is formed on the substrate that includes first and second conductive traces, a first antenna region, and at least one second antenna region. An integrated circuit is connected across the first and second conductive traces. The first antenna region is formed from a first material having a first conductivity and the at least one second antenna region is formed from a second material having a second conductivity.

In another aspect of the invention, an RFID tag comprises a substrate. An antenna is formed on the substrate that includes first and second conductive traces, a first antenna region, and at least one second antenna region. An integrated circuit is connected across the first and second conductive traces. The first antenna region is formed at a first thickness and the at least one second antenna region is formed at a second thickness.

In another aspect of the invention, a method of printing an RFID antenna with varying conductivity comprises determining current densities of a first region and at least one second region of the antenna. Conductivity requirements of the first and at least one second regions are determined according to the current densities. A first material is selected according to the conductivity requirements of the first region and a second material is selected according to the conductivity requirements of the at least one second region. The first material is printed to a substrate at the first region and the second material is printed to the substrate at the at least one second region.

In another aspect of the invention, a method of printing an RFID antenna with varying conductivity comprises determining current densities of a first region and at least one second region of the antenna. Conductivity requirements of the first and at least one second regions are determined according to the current densities. A conductive material is printed to a substrate at the first region at a first thickness according to the conductivity requirements of the first region. The conductive material is printed to the substrate at the at least one second region at a second thickness according to the conductivity requirements of the at least one second region.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
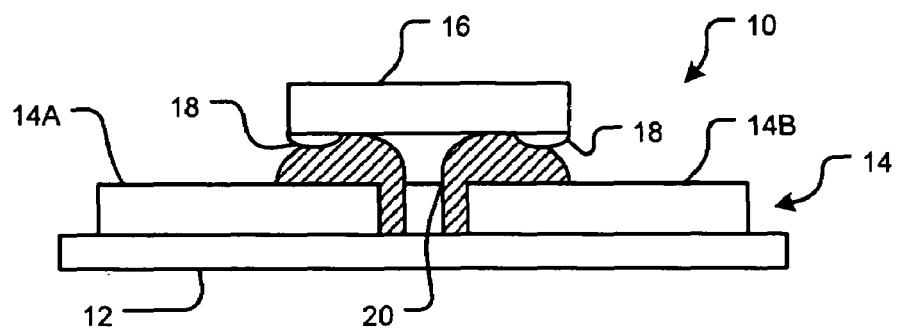
FIG. 1 is a cross-sectional view of an RFID antenna according to the prior art.

Referring now to FIG. 1, an RFID system 10 includes a substrate 12 having an antenna 14 printed and/or otherwise attached thereto. The antenna 14 includes first and second antenna components 14A and 14B. A transmitter is typically implemented using an integrated circuit (IC) 16 and is electronically programmed with a unique identification (ID) and/or information about the item. The IC 16 typically includes conductors 18 formed on one side thereof that are connected by conductive adhesive 20 to the antenna 14. In use, a transceiver containing a decoder communicates with transmitters that are within range.

Figure 2A:
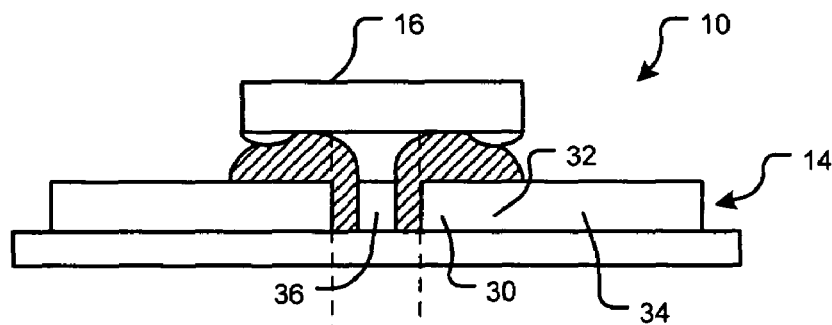
FIG. 2A is a cross-sectional view of an RFID antenna indicating general areas of the antenna pattern according to the prior art.
Figure 2B:
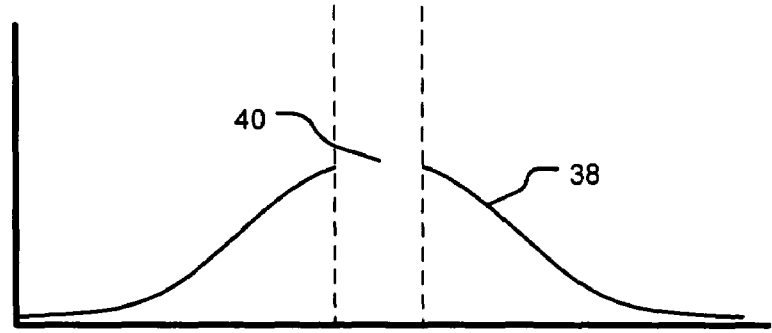
FIG. 2B illustrates current density of different areas of an RFID antenna.

The antenna 14 is typically comprised of one or more general areas, each with particular current density requirements, as shown in FIGS. 2A and 2B. A particular antenna pattern may include only one or all of the areas according to the antenna's frequency, intended application, and size. For example, an interconnection area 30 is located nearest the IC 16 and is often very sensitive to ink conductivity. The interconnection area 30 requires conductive lines and gaps that correspond with the features of the IC 16. Any electrical shorting of the gaps renders the RFID system 10 ineffective. Therefore, to maintain the gaps at a particular width, a single thick layer of conductive ink is printed at the interconnection area 30. For example, the RFID system 10 may require gaps narrower than 150 microns. A single thick layer of conductive ink provides high conductance and effectual gaps. Conversely, multiple applications of conductive ink may cause overlaps in the registration of printed layers due to limitations in the printing process. The overlaps result in printed layers that are relatively coarse.

A main antenna area 32 is designed according to the wavelength of the radio frequency that the antenna 14 is operable to receive. For example, the main antenna area 32 usually includes at least one dimension that is related to one, one half or one quarter of the operating wavelength. The main antenna area 32 requires less current density than the interconnection area 30. The conductive lines and gaps of the main antenna area 32 are typically not as narrow as the corresponding features of the interconnection area 30. For example, gaps of 200 microns may be sufficient for the main antenna area 32. Additionally, the current density may vary across the width of the main antenna area 32. The required current density of the main antenna area 32 may decrease proportionately to the distance from the IC 16. As current density changes across this area, conductive ink of greater or lesser thickness may be used accordingly to accommodate varying conductance requirements.

The antenna 14 may include an intermediate antenna area 34 that requires a low current density relative to the main antenna area 32. For example, the antenna 14 may be designed to include a thick, highly-conductive interconnect area 30, a thinner, less-conductive main antenna area 32, and an even thinner intermediate antenna area 34. The intermediate antenna area 34 may function as a half-wave or an RF-reflective patch. Therefore, the intermediate antenna area 34 does not require great thickness or high conductivity in the printed material. In certain embodiments, the intermediate antenna area 34 may be larger than one quarter, or even one half, of the total antenna size.

A coil area 36 functions to tune the antenna 14 to the capacitance or impedance of the integrated circuit 16. Additionally, the coil area 36 may be designed to include additional features, such as solid state or printed portions that add various capabilities to the RFID system 10. The coil area 36 is typically very sensitive to ink conductivity.

FIG. 2B illustrates the current density 38 of the antenna RFID system 10 relative to the different areas of the antenna 14. Generally, the current density is higher near the critical gap of the antenna 14, which is visible as a gap 40 in the current density. Further, current density is higher in the coil area, which is not shown in FIG. 2B. The current density decreases further away from the gap 40. Therefore, more conductive material may be used in the areas of the antenna that require higher current density; conversely, less conductive material may be used in areas that require less current density. Alternatively, material of higher conductivity may be used where more conductivity is required, and material of lower conductivity may be used were less conductivity is required. In this manner, the antenna can use less costly material in areas where greater conductivity is not required.

Figure 3A:
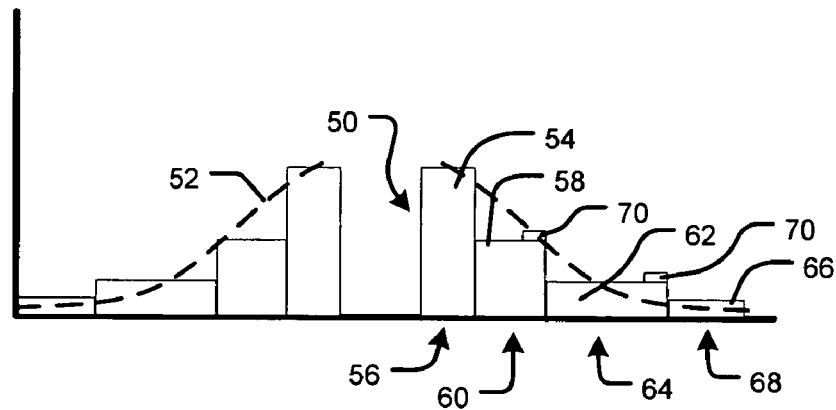
FIG. 3A illustrates a printing process for an RFID antenna according to the present invention.
Figure 3B:
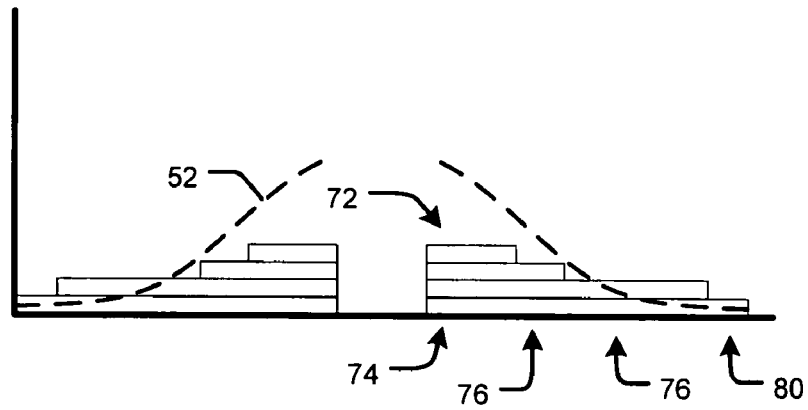
FIG. 3B illustrates an alternative embodiment of a printing process for an RFID antenna according to the present invention.

Referring now to FIGS. 3A and 3B, the printing process applies conductive material 50 according to the varying current density 52. Materials of different conductive capabilities may be printed according to the required current density of the particular antenna area as shown in FIG. 3A. For example, a first material 54 with a relatively high conductivity is printed with a first process in a first area 56, which requires relatively high current density. A second material 58 that is less conductive than the first material 54 is printed with a second process in a second area 60. The second area 60 requires less current density than the first area 56. A third material 62 is printed with a third process in a third area 64. A fourth material 66 is printed with a fourth process in a fourth area 68. The third area 64 requires less current density than the second area 60, and the fourth area 68 requires less current density than the third area 64. Correspondingly, the third material 62 is less conductive than the second material 58, and the fourth material 66 is less conductive than the third material 62.

Because the materials are printed consecutively, the process may produce minimal overlap between the materials. For example, the third material 62 may overlap the second material 58, or the fourth material 66 may overlap the third material 62, resulting in overlap regions 70. The varying printing processes used for the different antenna areas may include, but are not limited to, gravure, offset gravure, flexography, offset lithography, letterpress, ink jet, flatbed screen, and/or rotary screen printing. A particular printing process may be used for more than one area by further varying elements within the process. For example, flexography may be used for multiple processes by changing flexography units or adjusting anilox volume.

Alternatively, a single material 72 may be printed at varying thickness according to the required current density of the particular antenna area as shown in FIG. 3B. For example, areas 74, 76, 78, and 80 require varying current density. The material 72 is printed on all areas. However, the material 72 is printed using a different print unit for each area to achieve varying thickness across the entire process. The material 72 is printed using a first print unit for area 74, a second print unit for area 76, a third print unit for area 78, and a fourth print unit for area 80. The process as described in FIG. 3B avoids the potential overlap associated with using multiple print processes and multiple materials.

These antennas can be manufactured using printing processes, such as, but not limited to: gravure, offset gravure, flexography, offset lithography, letterpress, ink jet, flatbed screen, and/or rotary screen printing. Furthermore, the antenna can be patterned using etching, stamping, or electrochemical deposition (such as electrolysis or electroplating) of metals.

Figure 4A:
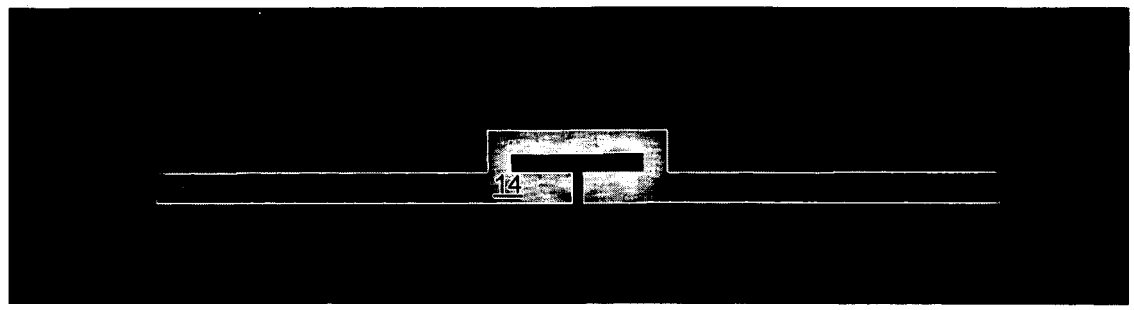
FIG. 4A illustrates a computer model of current density of an RFID antenna according to the present invention.
Figure 4B:
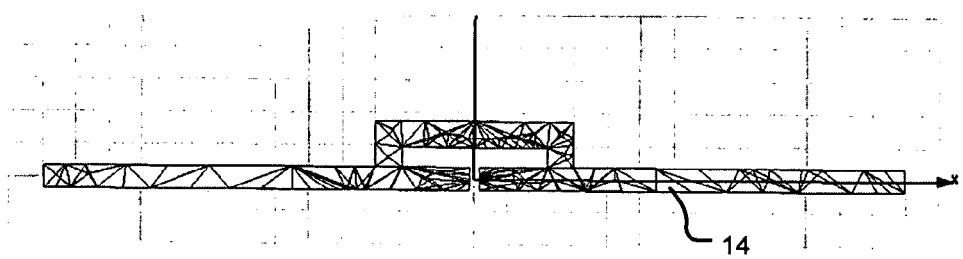
FIG. 4B illustrates a computer model mesh used to calculate current density according to the present invention.
Figure 4C:
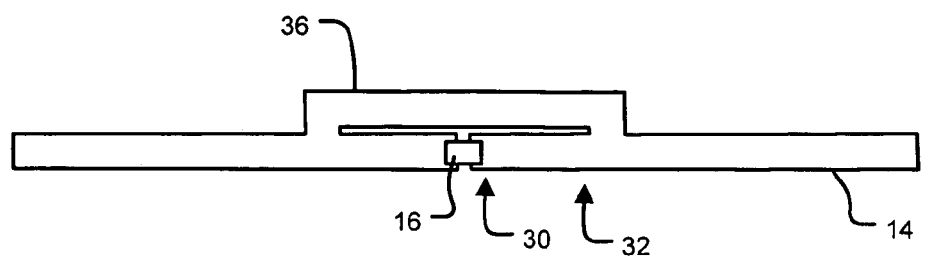
FIG. 4C is a top-down view of an exemplary print of an RFID antenna according to the present invention.

Referring now to FIGS. 4A, 4B, and 4C, computer simulation can be used to identify the different areas of required current density of the antenna 14. Further, computer simulation can be used to assess the sensitivity to ink thickness and conductivity of each antenna area. Through this process, a minimum conductivity level of each antenna area is identified, thereby preserving the performance of the device while minimizing the material cost.

For example, a computer model 82 may be used to demonstrate the varying degrees of current density as shown in FIG. 4A. Lighter areas of the computer model 82 indicate higher current density. Similarly, a computer model mesh 84 may be used to calculate current density as shown in FIG. 4B. The printing process is then adapted according to the current density calculations to apply thicker and/or more conductive material in the high current areas of the structure. The resulting RFID antenna structure therefore provides higher performance than a similar structure without proper conductivity in high current density areas. Correspondingly, the resulting RFID antenna structure can be manufactured at a lower cost than an antenna structure that is printed at a uniform thickness.

Although the above computer modeling method may be used to determine the current densities of different antenna areas, it is to be understood that other suitable methods may be used. A top-down view of an exemplary print of an RFID antenna 14 used to generate the computer model 82 and the computer model mesh 84 is shown in FIG. 4C. The RFID antenna 14 includes the IC 16, the interconnection area 30, the main antenna area 34, and the coil area 36. The corresponding current densities of these areas of the RFID antenna 14 are illustrated in FIGS. 4A and 4B.

Figure 5:
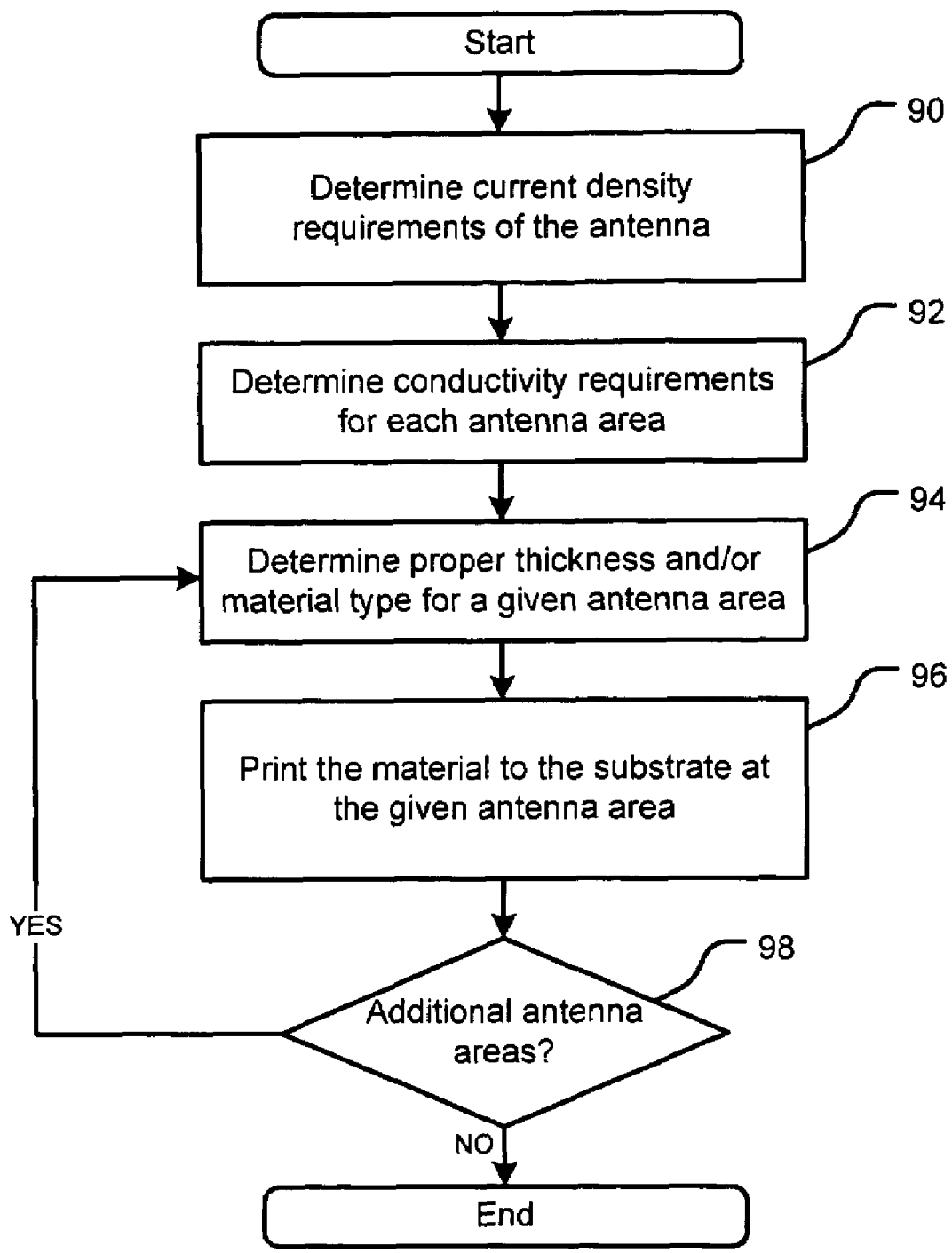
FIG. 5 illustrates steps of a method for printing an RFID antenna according to the present invention.

Referring now to FIG. 5, steps of a method according to the present invention are shown. In step 90, the current density requirements of the antenna are determined. For example, computer modeling may be used to calculate the current densities. The conductivity requirements for each area based on the current density calculations are determined at step 92. The proper thickness and/or a suitable material for a given antenna area are determined in step 94. The selected material is then printed to the substrate at the proper thickness at the antenna area in step 96. At step 98, the process is repeated for remaining antenna areas as necessary.

Those skilled in the art can now appreciate from the foregoing description that the broad teachings of the current invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An RFID tag, comprising:
    a substrate;
    an antenna formed on the substrate that includes first and second conductive traces, a first antenna region, and at least one second antenna region; and
    an integrated circuit that is connected across the first and second conductive traces,
    wherein the first antenna region is formed from a first material having a first conductivity and the at least one second antenna region is formed from a second material having a second conductivity, and
    wherein the RFID tag further comprises a third antenna region having a third conductivity, wherein said first antenna region comprises an interconnect area, said second antenna region comprises a main antenna area, and said third antenna region comprises an intermediate antenna area, and wherein said first conductivity is greater than either of said second and third conductivity.

2. The RFID tag of claim 1 wherein the first antenna region is a first distance from the integrated circuit and the at least one second antenna region is a second distance from the integrated circuit.

3. The RFID tag of claim 1 wherein the first antenna region has a first current density and the at least one second antenna region has a second current density.

4. The RFID tag of claim 2 wherein the second distance is greater than the first distance.

5. The RFID tag of claim 1 wherein the first conductivity is greater than the second conductivity.

6. The RFID tag of claim 1 wherein the at least one second antenna region comprises a coil region.

7. An RFID tag, comprising:
    a substrate;
    an antenna formed on the substrate that includes first and second conductive traces, a first antenna region, and at least one second antenna region; and
    an integrated circuit that is connected across the first and second conductive traces,
    wherein the first antenna region is formed at a first thickness and possesses a first conductivity,
    wherein the at least one second antenna region is formed at a second thickness and possesses a second conductivity,
    wherein the RFID tag further comprises a third antenna region possessing a third conductivity, wherein said first antenna region comprises an interconnect area, said second antenna region comprises a main antenna area, and said third antenna region comprises an intermediate antenna area, and wherein said first conductivity is greater than either of said second conductivity and said third conductivity.

8. The RFID tag of claim 7 wherein the first antenna region is a first distance from the integrated circuit and the at least one second antenna region is a second distance from the integrated circuit.

9. The RFID tag of claim 7 wherein the first antenna region has a first current density and the at least one second antenna region has a second current density.

10. The RFID tag of claim 8 wherein the second distance is greater than the first distance.

11. The RFID tag of claim 7 wherein the at least one second antenna region comprises a coil region.

12. A method of printing an RFID antenna with varying conductivity comprising:
    determining current densities of a first region and at least one second region of the antenna;
    determining conductivity requirements of the first and at least one second regions according to the current densities;
    selecting a first material according to the conductivity requirements of the first region and a second material according to the conductivity requirements of the at least one second region; and
    printing the first material to a substrate at the first region and the second material to the substrate at the at least one second region.

13. A method of printing an RFID antenna with varying conductivity comprising:
    determining current densities of a first region and at least one second region of the antenna;

determining conductivity requirements of the first and at least one second regions according to the current densities;

printing a conductive material to a substrate at the first region at a first thickness according to the conductivity requirements of the first region; and printing the conductive material to the substrate the at least one second region at a second thickness according to the conductivity requirements of the at least one second region.

14. The method of claim 12 wherein the first antenna region has a first current density and the at least one second antenna region has a second current density, wherein said printing prints the first material to a substrate at the first region and the second material to the substrate at the at least one second region.

15. The method of claim 12, wherein the first material has a first conductivity and the second material has a second conductivity, wherein the first conductivity is greater than the second conductivity, wherein said printing prints the first material to a substrate at the first region and the second material to the substrate at the at least one second region.

16. The method of claim 15 wherein the RFID antenna further comprises a third antenna region made from a third material having a third conductivity, wherein the first antenna region comprises an interconnect area, the second antenna region comprises a main antenna area, and the third antenna region comprises an intermediate antenna area, and wherein said first conductivity is greater than either the second and third conductivity, wherein said printing prints the first material to a substrate at the first region, the second material to the substrate at the at least one second region, and the third material to the substrate at the at least one third region.

17. The method of claim 13 wherein the first antenna region has a first current density and the at least one second antenna region has a second current density, wherein said printing prints the first material to a substrate at the first region and the second material to the substrate at the at least one second region.

18. The method of claim 13, wherein the first material has a first conductivity and the second material has a second conductivity, wherein the first conductivity is greater than the second conductivity, wherein said printing prints the first material to a substrate at the first region and the second material to the substrate at the at least one second region.

19. The method of claim 15 wherein the RFID antenna further comprises a third antenna region made from a third material having a third conductivity, wherein the first antenna region comprises an interconnect area, the second antenna region comprises a main antenna area, and the third antenna region comprises an intermediate antenna area, and wherein said first conductivity is greater than either the second and third conductivity, wherein said printing prints the first material to a substrate at the first region at a first thickness according to the conductivity requirements of the first region, the second material to the substrate at the at least one second region at a second thickness according to the conductivity requirements of the second region, and the third material to the substrate at the at least one third region at a third thickness according to the conductivity requirements of the third region.

20. A method of manufacturing an RFID antenna with varying conductivity comprising:

determining desired current densities of a first region and at least one second region of the antenna;

determining conductivity requirements of the first and at least one second regions according to the desired current densities;

selecting a first material according to the conductivity requirements of the first region and a second material according to the conductivity requirements of the at least one second region; and applying the first material to a substrate at the first region and the second material to the substrate at the at least one second region.

21. The method of claim 20 wherein the first antenna region has a first current density and the at least one second antenna region has a second current density, wherein said applying applies the first material to a substrate at the first region and the second material to the substrate at the at least one second region.

22. The method of claim 20, wherein the first material has a first conductivity and the second material has a second conductivity, wherein the first conductivity is greater than the second conductivity, wherein said applying applies the first material to a substrate at the first region and the second material to the substrate at the at least one second region.

23. The method of claim 22 wherein the RFID antenna further comprises a third antenna region made from a third material having a third conductivity, wherein the first antenna region comprises an interconnect area, the second antenna region comprises a main antenna area, and the third antenna region comprises an intermediate antenna area, and wherein said first conductivity is greater than either the second and third conductivity, wherein said applying applies the first material to a substrate at the first region, the second material to the substrate at the at least one second region, and the third material to the substrate at the at least one third region.

24. A method of printing an RFID antenna with varying conductivity comprising:

determining current densities of a first region and at least one second region of the antenna;

determining conductivity requirements of the first and at least one second regions according to the current densities;

applying a conductive material to a substrate at the first region at a first thickness according to the conductivity requirements of the first region; and applying the conductive material to the substrate the at least one second region at a second thickness according to the conductivity requirements of the at least one second region.

25. The method of claim 24 wherein the first antenna region has a first current density and the at least one second antenna region has a second current density, wherein said applying a conductive material to a substrate at the first region comprises applying a first material to a substrate at the first region and wherein said applying the conductive material to the substrate at the at least one second region comprises applying a second material to the substrate at the at least one second region.

26. The method of claim 25, wherein the first material has a first conductivity and the second material has a second conductivity, and wherein the first conductivity is greater than the second conductivity.

27. The method of claim 26 wherein the RFID antenna further comprises a third antenna region made from a third material having a third conductivity, wherein the first antenna region comprises an interconnect area, the second antenna region comprises a main antenna area, and the third antenna region comprises an intermediate antenna area, and wherein said first conductivity is greater than either the second and third conductivity, wherein said applying applies the first material to a substrate at the first region at a first thickness according to the conductivity requirements of the first region, the second material to the substrate at the at least one second region at a second thickness according to the conductivity requirements of the second region, and the third material to the substrate at the at least one third region at a third thickness according to the conductivity requirements of the third region.

28. The RFID tag of claim 1, wherein said second conductivity is greater than said third conductivity.

29. The RFID tag of claim 7, wherein said second conductivity is greater than said third conductivity.

30. The RFID tag of claim 7, wherein the first antenna region is formed at a first thickness, the at least one second antenna region is formed at a second thickness, and the at least third region is formed of a third thickness.

31. The RFID tag of claim 7, wherein said first conductive trace includes said first antenna region and said second antenna region.

32. The RFID tag of claim 31, wherein said integrated circuit is connected to said first antenna region, and wherein said second antenna region is connected to and disposed between said first antenna region and said third antenna region.

33. The RFID tag of claim 32, wherein said first conductivity is greater than said second conductivity, and wherein said second conductivity is greater than said third conductivity.

34. The RFID tag of claim 32, wherein said third antenna region is formed at a third thickness, wherein said first thickness is greater than said second thickness, and wherein said second thickness is greater than said third thickness.

35. The RFID tag of claim 1, wherein said first conductive trace includes said first antenna region and said second antenna region.

36. The RFID tag of claim 35, wherein said integrated circuit is connected to said first antenna region, and wherein said second antenna region is connected to and disposed between said first antenna region and said third antenna region.

37. The RFID tag of claim 36, wherein said first conductivity is greater than said second conductivity, and wherein said second conductivity is greater than said third conductivity.

* * * * *